(12) United States Patent
Chiu et al.

(10) Patent No.: US 8,420,495 B2
(45) Date of Patent: Apr. 16, 2013

(54) MANUFACTURING APPROACH FOR COLLECTOR AND A BURIED LAYER OF BIPOLAR TRANSISTOR

(75) Inventors: Tzuyin Chiu, Shanghai (CN); TungYuan Chu, Shanghai (CN); YungChieh Fan, Shanghai (CN); Wensheng Qian, Shanghai (CN); Fan Chen, Shanghai (CN); Jiong Xu, Shanghai (CN); Haifang Zhang, Shanghai (CN)

(73) Assignee: Shanghai Hua Hong Nec Electronics Company, Limited, Shanghai (CN)

( * ) Notice: Subject to any disclaimer, the term of this patent is extended or adjusted under 35 U.S.C. 154(b) by 0 days.

(21) Appl. No.: 12/979,999

(22) Filed: Dec. 28, 2010

(65) Prior Publication Data

US 2011/0159672 A1    Jun. 30, 2011

(30) Foreign Application Priority Data

Dec. 31, 2009  (CN) .......................... 2009 1 0202080

(51) Int. Cl.
*H01L 21/338* (2006.01)
*H01L 21/428* (2006.01)
*H01L 21/38* (2006.01)
*H01L 21/00* (2006.01)

(52) U.S. Cl.
USPC ........... 438/318; 438/359; 438/378; 438/524; 438/545; 438/795; 257/E29.034; 257/E21.537

(58) Field of Classification Search ................... 438/318, 438/343, 352, 359, 378, 524, 527, 545, 795; 257/E29.034, E29.114, E21.537
See application file for complete search history.

(56) References Cited

U.S. PATENT DOCUMENTS

| 6,716,709 | B1 * | 4/2004 | Springer et al. | 438/301 |
|---|---|---|---|---|
| 7,863,170 | B2 * | 1/2011 | Rohrer et al. | 438/526 |
| 2001/0005029 | A1 | 6/2001 | Kanamori | |
| 2006/0268139 | A1 | 11/2006 | Kobayashi et al. | |
| 2007/0264787 | A1 * | 11/2007 | Dunn et al. | 438/321 |
| 2011/0140239 | A1 * | 6/2011 | Chiu et al. | 257/565 |
| 2011/0147793 | A1 * | 6/2011 | Chiu et al. | 257/156 |
| 2011/0147892 | A1 * | 6/2011 | Chiu et al. | 257/565 |

OTHER PUBLICATIONS

U.S. Appl. No. 12/505,591, filed Jan. 21, 2010, Shanghai Hua Hong NEC Electronics.
U.S. Appl. No. 12/505,599, filed Jan. 21, 2010, Shanghai Hua Hong NEC Electronics.
U.S. Appl. No. 12/501,435, filed Jan. 21, 2010, Shanghai Hua Hong NEC Electronics.
U.S. Appl. No. 12/978,552, filed Jun. 30, 2011, Shanghai Hua Hong NEC Electronics.
U.S. Appl. No. 12/963,242, filed Jun. 16, 2011, Shanghai Hua Hong NEC Electronics.

(Continued)

*Primary Examiner* — Kevin Parendo
(74) *Attorney, Agent, or Firm* — Ming Chow; Sinorica, LLC

(57) ABSTRACT

This invention disclosed a manufacturing approach of collector and buried layer of a bipolar transistor. One aspect of the invention is that a pseudo buried layer, i.e, collector buried layer, is manufactured by ion implantation and thermal anneal. This pseudo buried layer has a small area, which makes deep trench isolation to divide pseudo buried layer unnecessary in subsequent process. Another aspect is, the doped area, i.e, collector, is formed by ion implantation instead of high cost epitaxy process. This invention simplified the manufacturing process, as a consequence, saved manufacturing cost.

4 Claims, 7 Drawing Sheets

OTHER PUBLICATIONS

U.S. Appl. No. 12/960,065, filed Jun. 9, 2011, Shanghai Hua Hong NEC Electronics.
U.S. Appl. No. 12/958,080, filed Jun. 9, 2011, Shanghai Hua Hong NEC Electronics.
U.S. Appl. No. 12/960,133, filed Jun. 9, 2011, Shanghai Hua Hong NEC Electronics.
U.S. Appl. No. 12/966,078, filed Jun. 16, 2011, Shanghai Hua Hong NEC Electronics.
U.S. Appl. No. 12/966,241, filed Jun. 23, 2011, Shanghai Hua Hong NEC Electronics.
U.S. Appl. No. 12/975,545, filed Jun. 30, 2011, Shanghai Hua Hong NEC Electronics.
U.S. Appl. No. 12/960,166, filed Jun. 9, 2011, Shanghai Hua Hong NEC Electronics.
U.S. Appl. No. 12/979,674, filed Jun. 30, 2011, Shanghai Hua Hong NEC Electronics.
U.S. Appl. No. 12/979,802, filed Jun. 30, 2011, Shanghai Hua Hong NEC Electronics.
U.S. Appl. No. 12/979,907, filed Jun. 30, 2011, Shanghai Hua Hong NEC Electronics.
U.S. Appl. No. 12/505,591, filed Jul. 20, 2009, Shanghai Hua Hong NEC Electronic.
U.S. Appl. No. 12/505,599, filed Jul. 20, 2009, Shanghai Hua Hong NEC Electronic.
U.S. Appl. No. 12/501,435, filed Jul. 12, 2009, Shanghai Hua Hong NEC Electronic.
U.S. Appl. No. 12/978,552, filed Dec. 25, 2010, Shanghai Hua Hong NEC Electronic.
U.S. Appl. No. 12/963,242, filed Dec. 8, 2010, Shanghai Hua Hong NEC Electronic.
U.S. Appl. No. 12/960,065, filed Dec. 3, 2010, Shanghai Hua Hong NEC Electronic.
U.S. Appl. No. 12/958,080, filed Dec. 1, 2010, Shanghai Hua Hong NEC Electronic.
U.S. Appl. No. 12/960,133, filed Dec. 3, 2010, Shanghai Hua Hong NEC Electronic.
U.S. Appl. No. 12/966,078, filed Dec. 13, 2010.
U.S. Appl. No. 12/966,241, filed Dec. 13, 2010, Shanghai Hua Hong NEC Electronic.
U.S. Appl. No. 12/975,545, filed Dec. 22, 2010, Shanghai Hua Hong NEC Electronic.
U.S. Appl. No. 12/960,166, filed Dec. 3, 2010, Shanghai Hua Hong NEC Electronic.
U.S. Appl. No. 12/979,674, filed Dec. 28, 2010, Shanghai Hua Hong NEC Electronic.
U.S. Appl. No. 12/979,802, filed Dec. 28, 2010, Shanghai Hua Hong NEC Electronic.

* cited by examiner

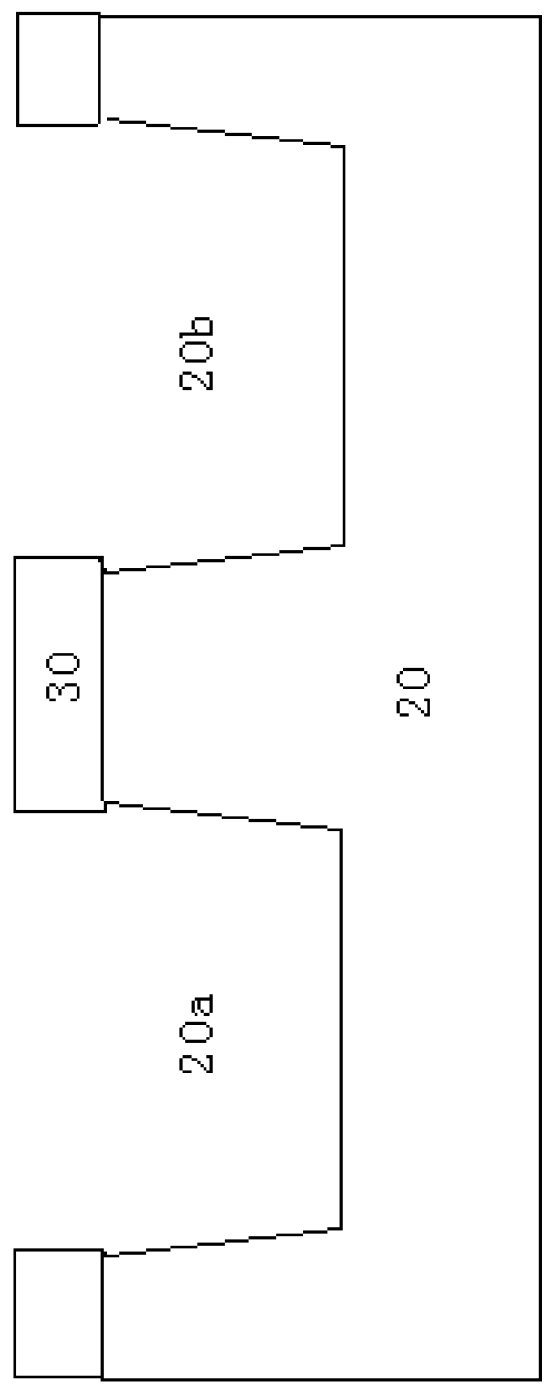

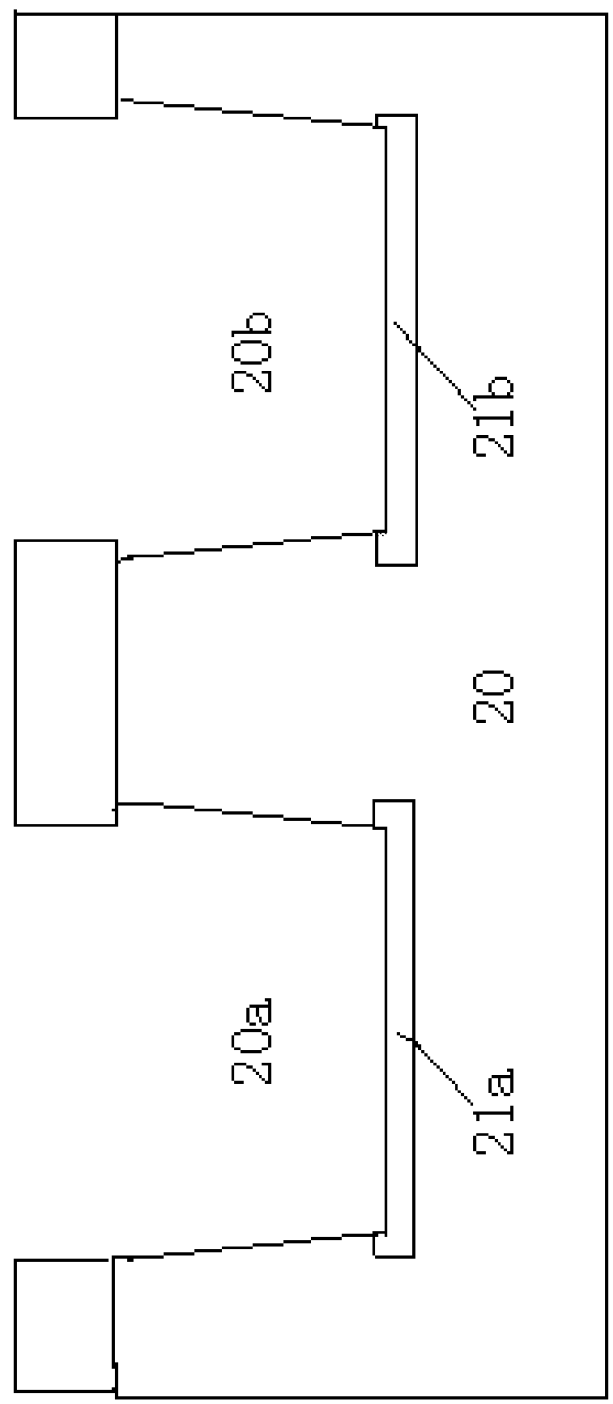

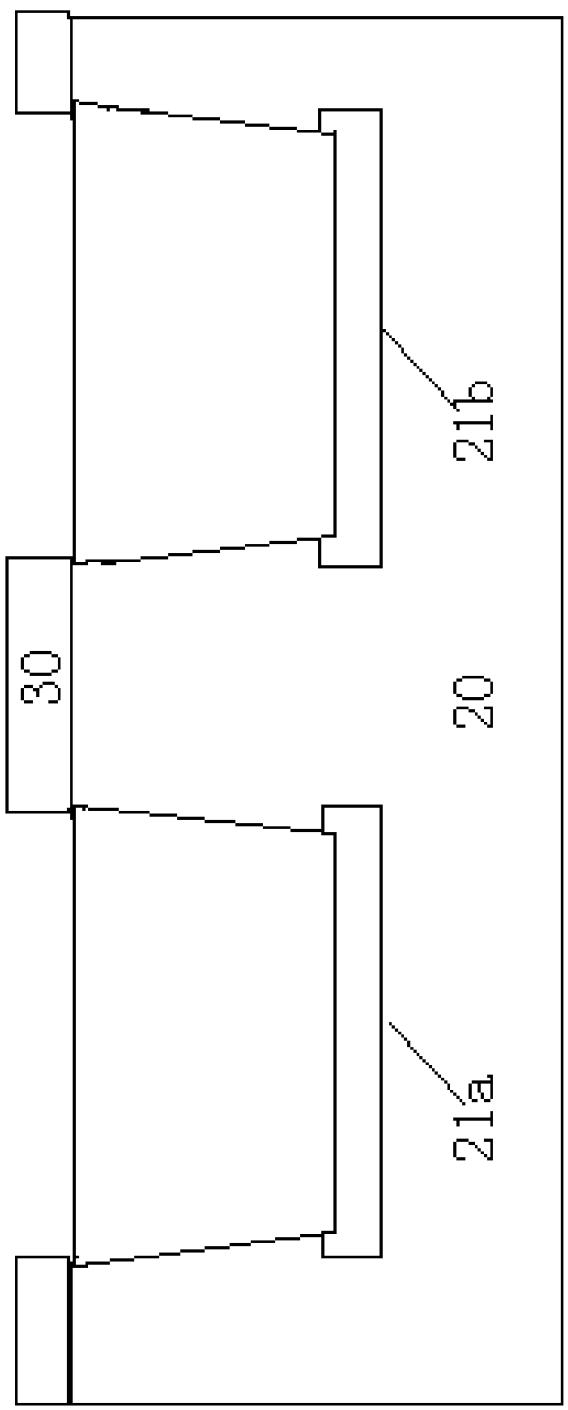

MANUFACTURING APPROACH FOR COLLECTOR AND A BURIED LAYER OF BIPOLAR TRANSISTOR

The current application claims a foreign priority to application in China 200910202080.8 filed on Dec. 31, 2009.

FIELD OF THE INVENTION

This invention belongs to one type of bipolar transistor (BJT). More particularly it relates to one type of collector of bipolar transistor.

BACKGROUND OF THE INVENTION

A conventional bipolar transistor is illustrated in FIG. 1. PNP bipolar transistor has same structure as NPN bipolar transistor, with only reverse impurity type of every parts of device. NPN bipolar transistor is illustrated here as example. N type heavily doped region 11 is above p type substrate 10. N type epitaxy layer 12 (doping level is lower than buried layer 11, normally medium or low doped) is above heavily doped n buried layer 11. There are a few shallow trench isolation (STI) structures 13a/13b/13c/13d among n type epitaxy layer 12. The bottom of these STI is in contact with buried layer 11. N type heavily doped region 14 exists between STI 13a/13b or 13c/13d inside epitaxy layer 12, which is used as collector reach through (sinker). P type base 15 is on top of n type epitaxy layer 12. Base 15 is semiconductor material, such as silicon, silicon germanium alloy, etc. It is connected to base pick up B. Heavily doped emitter poly 16 is on top of base 15. It is connected to emitter pick up E. In all, n type emitter 16, p type base 15, n type epitaxy layer 12 and n type buried layer 11 formed NPN bipolar transistor vertically.

In bipolar transistor illustrated in FIG. 1, n type epitaxy layer 12 between STI 13b and 13c is collector of the bipolar transistor. The collector picks up to C through n type heavily doped buried layer 11 (collector buried layer) and n type heavily doped sinker 14. The collector buried layer area is large by this approach. Consequently the parasitic capacitance with substrate is also large. A deep trench isolation structure 130a/130d is commonly formed under STI 13a/13d which surround entire bipolar transistor. Deep trench isolation structure 130a/130d extend through n type heavily doped buried layer 11 until inside p type substrate 10. It cuts through n type heavily doped layer 11, in order to reduce junction area of collector buried layer to p type substrate 10, and reduce parasitic capacitance between them.

FIG. 1 is only illustration of a bipolar transistor. There may be variations of each portion during real manufacturing.

Following process steps are normally adopted for collector and buried layer of above mentioned bipolar transistor:

Step 1: n type impurity is ion implanted into p type substrate. The commonly used n type impurities are Phosphorus (P), Arsenic (As), Antimony, etc. N type heavily doped buried layer 11 is formed then.

Step 2: N type epitaxy layer 12 is grown (deposit one layer of n type single crystal 12) on top of n type heavily doped buried layer 11. The doping level of 12 is lower than heavily doped buried layer 11.

Step 3: Shallow trench was etched inside silicon. The depth of shallow trench is normally below 2 um. The position of shallow trench is shown in FIG. 1 as 13a/13b/13c/13d.

A deep trench is then etched at the bottom of STI which encloses entire bipolar transistor. The depth of deep trench is normally more than 7 um. The position of deep trench is indicated as 130a/130d in FIG. 1.

Dielectric such as silicon ($SiO_2$) is then filled into shallow trench. The shallow trench isolation structures 13a/13b/13c/13d are formed.

N type epitaxy layer 12 between STI 13b/13c is the collector.

There are a few disadvantages of this approach of forming collector and buried layer of above bipolar transistor. First, the cost of growing n type single crystal 12 on top of silicon substrate 12 is high. Second, the depth of deep trench isolation structure 130a/130d is more than 7 um. Etch and fill in process are complex and expensive.

SUMMARY OF THE INVENTION

It is therefore an object of present invention to offer a manufacturing approach of collector and buried layer of one type of bipolar transistor. There is no process of buried layer and epitaxy.

Following process steps are included in the manufacturing approach of collector and buried layer of bipolar transistor.

Step 1: Shallow trench 20a, 20b is etched on silicon substrate 20. The depth of the trench is less than 2 um.

Step 2: The bottom of above stated STI 20a/20b is doped with n type impurity by method of ion implantation. A doped region 21a/21b in the substrate 20 is formed near the bottom of above stated STI 20a/20b.

Step 3: Dielectric is filled into above stated shallow trench 20a/20b. Shallow trench isolation 22a/22b is then formed.

Step 4: The wafers undergo high temperature anneal process. Above mentioned doped area 21a/21b merges between STI 22a/22b through lateral diffusion. Pseudo buried layer 21 is formed.

The pseudo buried layer 21 is collector buried layer of above mentioned bipolar transistor.

Step 5: The silicon substrate between STI 22a/22b and above pseudo buried layer go through single or multiple ion implantation. The above mentioned active region 20 is converted into doped region 23.

The doped region (23) is the collector of the bipolar transistor. The doping level should below that of pseudo buried layer 21.

BRIEF DESCRIPTION OF THE DRAWINGS

The foregoing and the object, features, and advantages of the invention will be apparent from the following detailed description of the invention, as illustrated in the accompanying drawings, in which:

FIGS. 3a~3d are step by step illustration of manufacturing approach of collector and buried layer of present invented bipolar transistor.

EXPLANATION OF THE LABELS

| | |
|---|---|
| 10: P type substrate; | 11: N type heavily doped buried layer; |
| 12: N type epitaxy layer; | 13a/13b/13c/13d: Shallow trench isolation structure |
| 130a/130d: Deep trench isolation; | 14: N type heavily doped region; |
| 15: Base; | 16: Emitter; |
| 20: Silicon substrate; | 20a/20b: Shallow trench; |
| 21a/21b: Doped zone; | 21: Pseudo buried layer; |
| 22a/22b: Shallow trench isolation structure; | 23: Doped region. |
| C: Collector pick up; | B: Base pick up; |
| E: Emitter pick up; | |

DETAILED DESCRIPTION OF THE INVENTION

Figure 1:
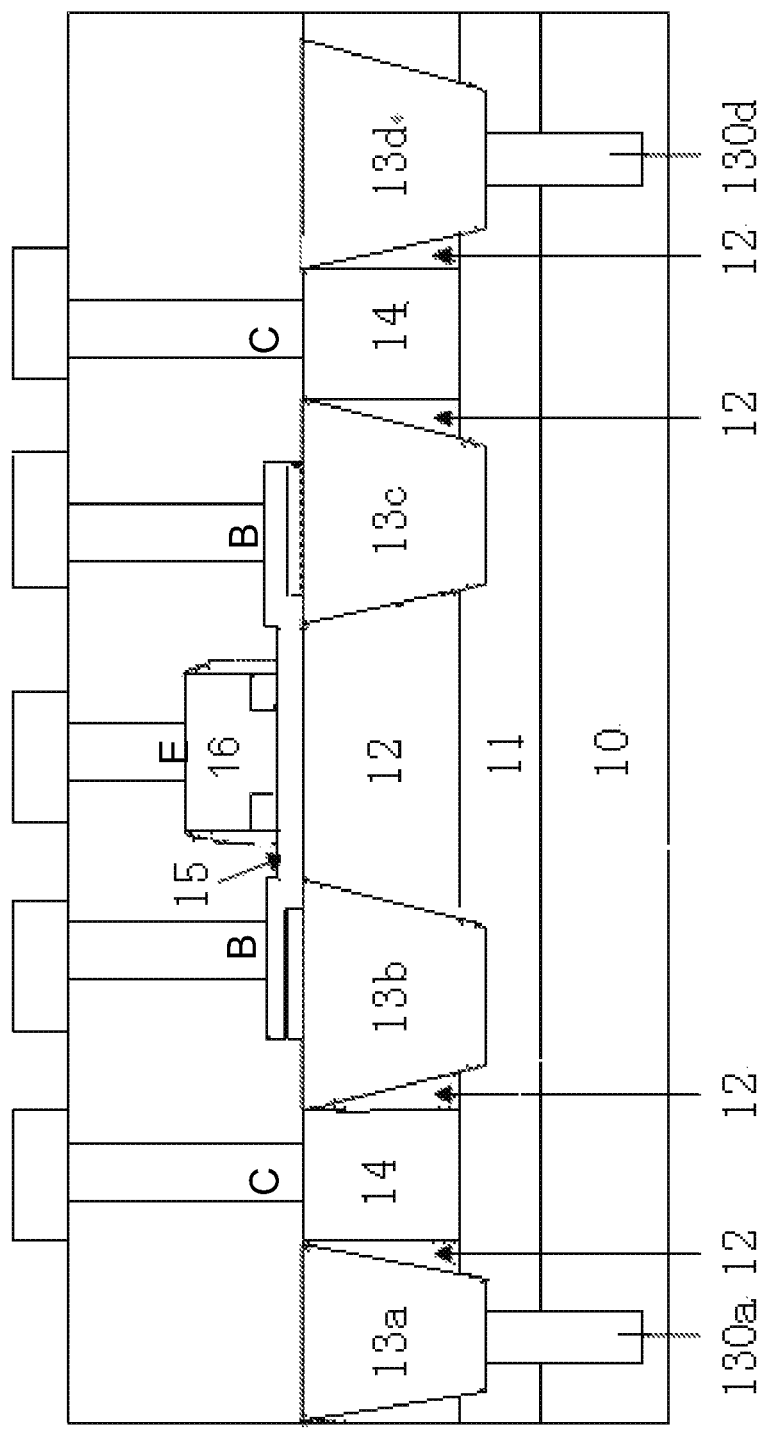
FIG. 1 is conventional bipolar transistor structure cross section view.
Figure 2:
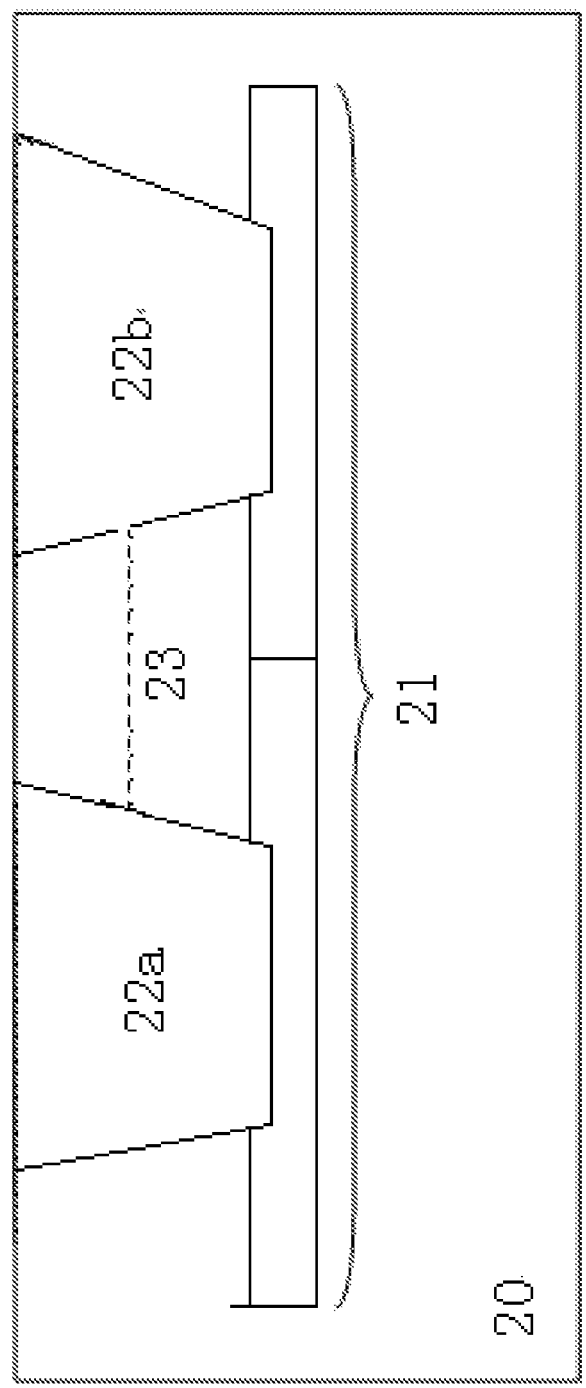
FIG. 2 is collector and buried layer of present invented bipolar transistor.

Refer to FIG. 2, silicon substrate 20 of present invented bipolar transistor includes:

Shallow trench isolation structure 22a/22b, the active region between shallow trench isolation region 22a/22b is the collector of bipolar transistor.

Pseudo buried layer 21, lies at the bottom of STI region 22a/22b, is continuous between 22a/22b (merge together instead of two separate regions). Above stated pseudo buried layer is the collector buried layer of the bipolar transistor.

Doped region 23 is the active region between 22a/22b and above pseudo buried layer 21. The doping level of 23 is less than that of pseudo buried layer 21. Doped region 23 is the collector of bipolar transistor.

For NPN bipolar transistor, above stated substrate 10 is p type. Pseudo buried layer 21 and doped region 23 are all n type. For PNP bipolar transistor, above stated substrate 10 is n type. Pseudo buried layer 21 and doped region 23 are all p type.

The collector and buried layer of invented bipolar transistor follows the process steps as below (take NPN bipolar transistor as example, just revert the doping type to get PNP bipolar transistor):

Step 1: refer to FIG. 3a, shallow trench 20a/20b is etched using conventional approach. The depth of the trench is less than 2 um. From top view, shallow trench 20a/20b is just like 2 parallel line of a rectangle.

Steps to get a shallow trench isolation (STI) process normally include:

Step 1.1, thin $SiO_2$ layer is grown thermally on silicon surface. This $SiO_2$ layer is called pad oxide. It is used to protect active region from chemical contamination when silicon nitride ($Si_3N_4$) is removed in subsequent process.

Step 1.2, $Si_3N_4$ is deposited on silicon surface. $Si_3N_4$ is a hard dielectric material used here as hard mask. It is used to protect the active region when perform STI dielectric fill-in and use as a stop layer in subsequent chemical-mechanical polish (CMP) process.

Step 1.3, photo resist is coated on silicon surface, followed by exposure and develop step. An etch window is exposed.

Step 1.4, $Si_3N_4$ and $SiO_2$ are etched away, and partial of silicon substrate is also etched away. Shallow trench is formed. $Si_3N_4$ and $SiO_2$ stated in step 1.1/1.2 is the hard mask 30 that covers silicon substrate 20 in FIG. 3a.

Step 2: refer to FIG. 3b, n type impurity is ion implanted into the bottom of shallow trench 20a/20b. Heavily doped n type region 21a/21b is formed near the bottom of shallow trench 20a/20b of silicon substrate 10. Two doped region 21a/21b between shallow trench 20a/20b have not connected yet. They are two separate regions instead.

After shallow trench is etched, a thermal grown oxide is commonly grown on shallow trench sidewall and bottom. This silicon oxide calls liner oxide. It is used to improve the interface characteristics between shallow trench silicon and the dielectric filled. This liner oxide is very thin which have no impact to ion implantation.

Step 3: refer to FIG. 3c, dielectric is filled into shallow trench 20a/20b and shallow trench isolation structure 22a/22b is formed. The dielectric used is normally silicon oxide ($SiO_2$), silicon nitride ($Si_3N_4$), silicon nitride oxide (SiOxNy, x/y is integer).

The process in forming STI also includes:

Step 3.1, a layer of dielectric such as silicon oxide is filled in. The dielectric should at least fill in shallow trench fully.

Step 3.2, silicon wafer is polished using chemical-mechanical polish process. The filled dielectric should be in same height as silicon top surface.

Step 3.3, $Si_3N_4$ is removed by wet etch process.

Figure 3D:
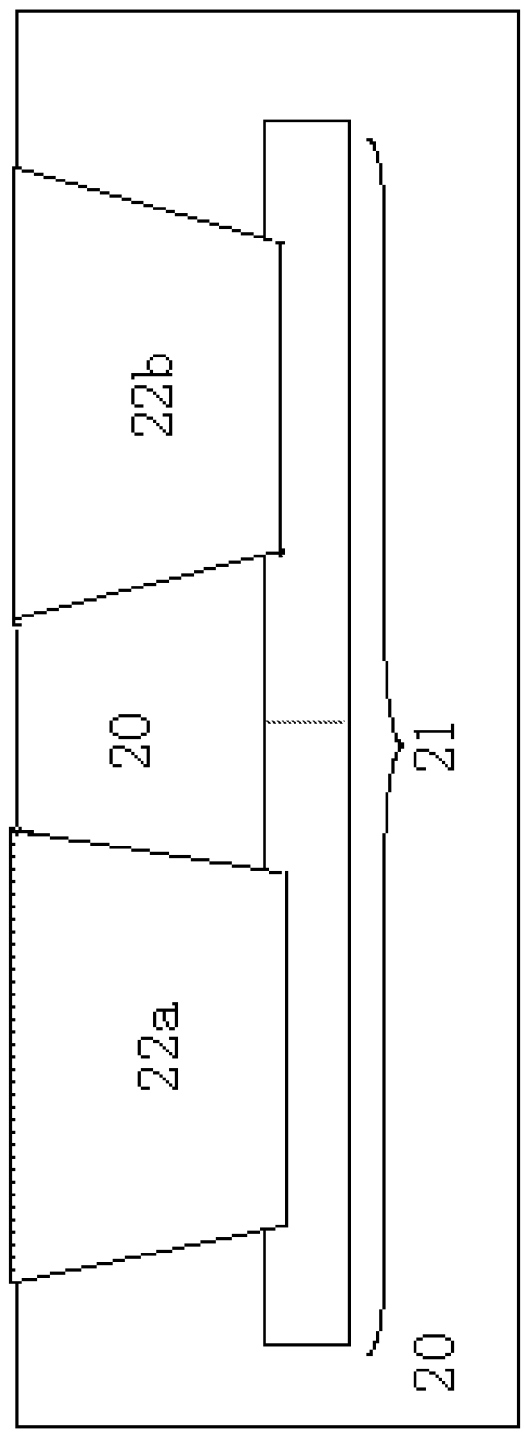
Figure 4:
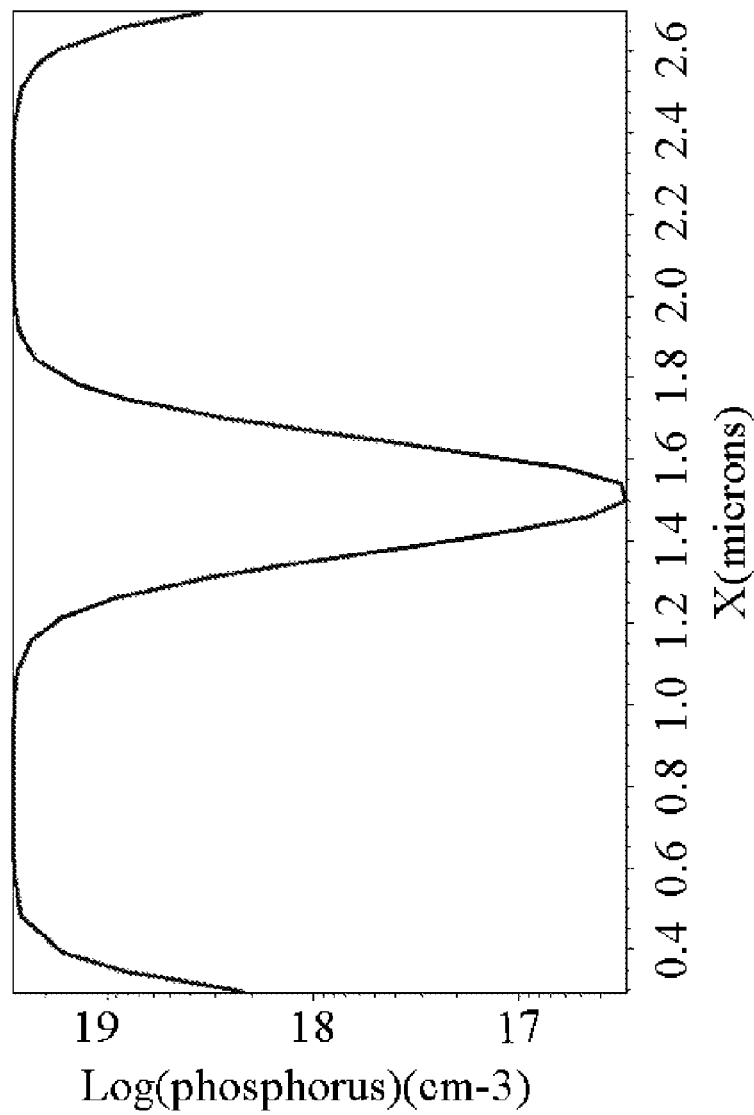
FIG. 4 presents an illustration of dopant concentration of collector buried layer of present invention.

Step 4, refer to FIG. 3d, thermal anneal process is carried out for the wafer, two heavily doped regions 21a/21b diffuse laterally and vertically. The lateral diffusion results in link of two heavily doped region 21a/21b. between shallow trench isolation structure 22a/22b. Pseudo buried layer 21 is then formed. The n type heavily doped region 21 is the collector buried layer of whole bipolar transistor.

In FIG. 3d, as main part ($Si_3N_4$ deposited in step 1.2) of hard mask 30 is removed, hard mask is no longer illustrated in FIG. 3d. The pad oxide grown in step 1.1 is not shown in FIG. 3d as it is too thin.

Step 5, refer to FIG. 2, single or multiple n type impurity ion implant is performed to substrate 10 which is between STI 22a/22b and on top of pseudo buried layer 21. Silicon substrate active region 10 is then converted into n type. The doping level is less than that of pseudo buried layer 21. The doped region 23 is the collector of whole bipolar transistor.

In step 2, ion implantation should be carried out in high dose low energy method. The so called "high dose" is $1 \times 10^{14} \sim 1 \times 10^{16}$ per square centimeter. Phosphorous, Arsenic, Antimony can be chosen as n type impurity. Boron, Boron Fluoride can be chosen as p type impurity. The ion dose is $1 \times 10^{14} \sim 1 \times 10^{16}$ per square centimeter. Indium can also be chosen as p type impurity, the ion implantation dose is $1 \times 10^{14} \sim 1 \times 10^{16}$ atom per square centimeter (or ion dose per square centimeter). The "low energy" stated above means ion implant energy less than 30 keV.

In step 4 stated above, high temperature anneal choose rapid thermal anneal (RTA) process.

In step 5 stated above, ion implantation should be carried out in medium to low dose. The so called "medium to low dose" means ion implantation dose is generally less than $1 \times 10^{14}$ atom per square centimeter (or ion dose per square centimeter).

The invention claimed is:

1. A manufacturing process for a collector and a buried layer of a bipolar transistor comprises,
   step 1: etching shallow trenches on a silicon substrate wherein depth of the trench is less than 2 μm;
   step 2: doping bottoms of the shallow trenches with an impurity by ion implantation;
   forming one or more doped regions in the silicon substrate near the bottom of the shallow trenches;
   step 3: filling a dielectric into the shallow trenches to form a shallow trench isolation (STI);

step 4: annealing the silicon substrate with a predetermined temperature; linking the doped regions through lateral diffusion to form a pseudo buried layer, step 5: implanting an active region between the STIs and above the pseudo buried layer by one or more ion implantations to convert the active region into the collector, wherein a doping concentration of the collector is lower than that of the pseudo buried layer.

2. The manufacturing process of claim 1, wherein either a NPN bipolar transistor or a PNP bipolar transistor is formed; wherein, if the NPN bipolar transistor is formed:
  in step 1, the silicon substrate is p-type;
  in step 2, the impurity is n-type and the doped regions are n-type;
  in step 4, the pseudo buried layer is n-type and is doped;
  in step 5, the one or more ion implantations are n-type and the collector is n-type;
wherein, if the PNP bipolar transistor is formed:
  in step 1, the silicon substrate is n-type;
  in step 2, the impurity is p-type and the doped regions are p-type;
  in step 4, the pseudo buried layer is p-type and is doped;
  in step 5, the one or more ion implantations are p-type and the collector is p-type.

3. The manufacturing process of claim 1, wherein, in step 2, the ion implantation is carried out with a high ion dose and a low ion implant energy of less than 30 keV; wherein, if phosphorus, arsenic, antimony, titanium, or indium are implanted, the high ion dose is $1\times10^{14}$~$1\times10^{16}$ atoms per square centimeter, and if boron or boron fluoride is implanted, the high ion dose is $10^{13}$~$1\times10^{16}$ atoms per square centimeter.

4. The manufacturing process of claim 1 wherein: in step 2, the ion implantation is carried out with a high dose of $1\times10^{13}$~$1\times10^{16}$ atoms per square centimeter and a high ion implant energy of more than 30 KeV and the ion implantation is performed to the silicon substrate between the STIs, and three doped regions are formed in silicon substrate; in step 4, the pseudo buried layer is formed by combining the three doped regions.

* * * * *